US007230868B2

United States Patent
Madan et al.

(10) Patent No.: US 7,230,868 B2
(45) Date of Patent: Jun. 12, 2007

(54) STABLE SOURCE-COUPLED SENSE AMPLIFIER

(75) Inventors: Sudhir K. Madan, Richardson, TX (US); Bryan Sheffield, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 132 days.

(21) Appl. No.: 11/191,709

(22) Filed: Jul. 28, 2005

(65) Prior Publication Data

US 2007/0036012 A1    Feb. 15, 2007

(51) Int. Cl.
    *G11C 7/06* (2006.01)
(52) U.S. Cl. ............... 365/207; 365/205; 365/190; 365/196; 365/203; 365/208; 327/51; 327/52; 327/55; 327/57
(58) Field of Classification Search ........... 365/203, 365/205, 207, 208, 185.21, 189.05, 189.07, 365/190, 210, 185.2, 196; 327/51, 52, 55, 327/57
    See application file for complete search history.

(56) References Cited

U.S. PATENT DOCUMENTS

| | | | | |
|---|---|---|---|---|
| 5,345,419 A | * | 9/1994 | Fenstermaker et al. | 365/189.04 |
| 5,477,497 A | * | 12/1995 | Park et al. ............... | 365/205 |
| 5,644,418 A | * | 7/1997 | Woodward .............. | 398/209 |
| 6,043,527 A | * | 3/2000 | Forbes ................... | 257/296 |
| 6,288,575 B1 | * | 9/2001 | Forbes ................... | 327/57 |
| 6,424,181 B1 | * | 7/2002 | Pogrebnoy .............. | 327/55 |
| 7,023,243 B2 | * | 4/2006 | Wijetunga et al. ........ | 327/57 |

OTHER PUBLICATIONS

Evert Seevinck et al., "Current-Mode Techniques for High-Speed VLSI Circuits with Application to Current Sense Amplifier for CMOS SRAM's," *IEEE Journal of Solid-State Circuits*, vol. 26, No. 4, Apr. 1991, pp. 525-536.
Travis N. Blalock et al., "A High-Speed Sensing Scheme for 1T Dynamic RAM's Utilizing the Clamped Bit-Line Sense Amplifier," *IEEE Journal of Solid-State Circuits*, vol. 27, No. 4, Apr. 1992, pp. 618-625.
Travis N. Blalock et al., "A High-Speed Clamped Bit-Line Current-Mode Sense Amplifier," *IEEE Journal of Solid-State Circuits*, vol. 26, No. 4, Apr. 1991, pp. 542-548.
Aiyappan Natarajan et al., "A Study of Sense Amplifiers for Advanced Microprocessor Caches in 70nm Technology," Intel Circuit Research Labs (CRL), Hillsboro, OR.

* cited by examiner

*Primary Examiner*—J. H. Hur
(74) *Attorney, Agent, or Firm*—Jacqueline J. Garner; W. James Brady, III; Frederick J. Telecky, Jr.

(57) ABSTRACT

An amplifier circuit includes an amplifier section (700), an equalization section (770), and an activation section (720). The P-channel transistors (702, 704) of the amplifier section are coupled to a supply terminal (802). The N-channel transistors (706, 708) of the amplifier section are coupled between the P-channel transistors and the first and second input terminals (760, 762), respectively. In the activation section, first and second pull down transistors (722, 724) are coupled between the first and second input terminals, respectively, and a second power supply terminal (726), and third pull down transistor between the first and second input terminals. The control gates of the first, second and third pull down transistors are coupled to each other. In operation, a voltage signal applied to the first and second input terminals is amplified by the N-channel transistors. A control signal is then applied to couple the first and second input terminals to a supply voltage.

35 Claims, 7 Drawing Sheets

FIG. 1
(PRIOR ART)
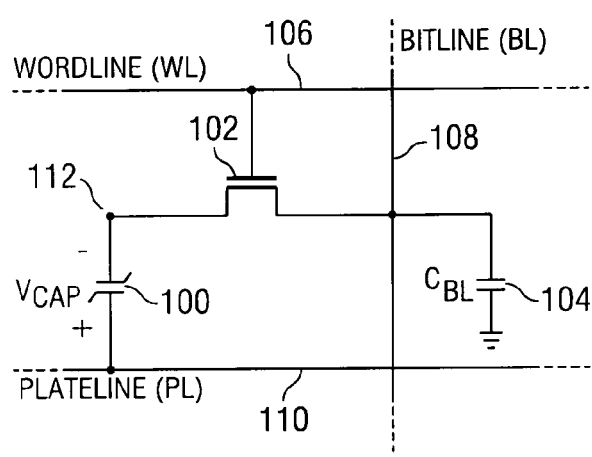
FIG. 2
(PRIOR ART)
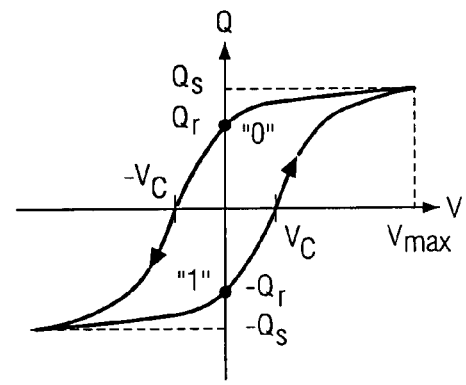
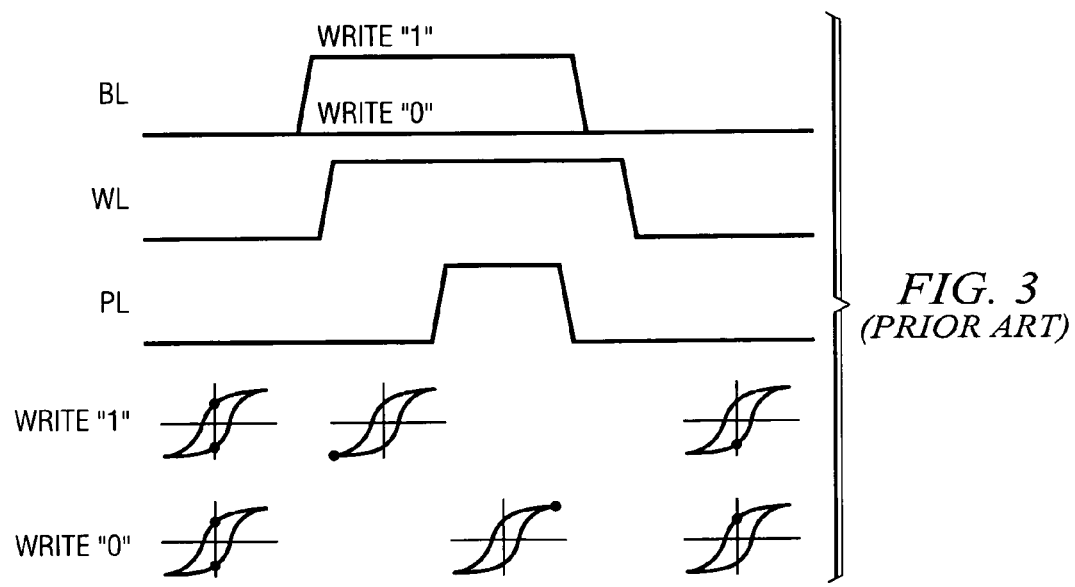
FIG. 3
(PRIOR ART)

STABLE SOURCE-COUPLED SENSE AMPLIFIER

FIELD OF THE INVENTION

This invention generally relates to electronic circuits, and more specifically to noise reduction in semiconductor integrated circuits.

BACKGROUND OF THE INVENTION

Nonvolatile memory circuits such as electrically erasable programmable read only memories (EEPROM) and Flash EEPROMs have been widely used for several decades in various circuit applications including computer memory, automotive applications, and video games. Many new applications, however, require the access time and packing density of previous generation nonvolatile memories in addition to low power consumption for battery powered circuits. One nonvolatile memory technology that is particularly attractive for these low power applications is the ferroelectric memory cell. A major advantage of these ferroelectric memory cells is that they require approximately three orders of magnitude less energy for write operations than previous generation floating gate memories. Furthermore, they do not require high voltage power supplies for programming and erasing charge stored on a floating gate. Thus, circuit complexity is reduced and reliability increased.

The term ferroelectric is something of a misnomer, since present ferroelectric capacitors contain no ferrous material. Typical ferroelectric capacitors include a dielectric of ferroelectric material formed between two closely-spaced conducting plates. One well-established family of ferroelectric materials known as perovskites has a general formula $ABO_3$. This family includes Lead Zirconate Titanate (PZT) having a formula $Pb(Zr_xTi_{1-x})O_3$. This material is a dielectric with a desirable characteristic that a suitable electric field will displace a central atom of the lattice. This displaced central atom, either Titanium or Zirconium, remains displaced after the electric field is removed, thereby storing a net charge. Another family of ferroelectric materials is Strontium Bismuth Titanate (SBT) having a formula $SbBi_2Ta_2O_9$. However, both ferroelectric materials suffer from fatigue and imprint. Fatigue is characterized by a gradual decrease in net stored charge with repeated cycling of a ferroelectric capacitor. Imprint is a tendency to prefer one state over another if the ferroelectric capacitor remains in that state for a long time.

A typical one-transistor, one-capacitor (1T1C) ferroelectric memory cell of the prior art is illustrated at FIG. 1. The ferroelectric memory cell is similar to a 1T1C dynamic random access memory (DRAM) cell except for ferroelectric capacitor 100. The ferroelectric capacitor (FeCAP) 100 is connected between plateline 110 and storage node 112. Access transistor 102 has a current path connected between bitline 108 and storage node 112. A control gate of access transistor 102 is connected to wordline 106 to control reading and writing of data to the ferroelectric memory cell. This data is stored as a polarized charge corresponding to cell voltage $V_{CAP}$. Parasitic capacitance of bitline BL is represented by capacitor $C_{BL}$ 104.

Referring to FIG. 2, there is a hysteresis curve corresponding to the ferroelectric capacitor 100. The hysteresis curve includes net charge Q or polarization along the vertical axis and voltage along the horizontal axis. By convention, the polarity of cell voltage is defined as shown in FIG. 1. A stored "0", therefore, is characterized by a positive voltage at the plateline terminal with respect to the access transistor terminal. A stored "1" is characterized by a negative voltage at the plateline terminal with respect to the access transistor terminal. A "0" is stored in a write operation by applying a voltage Vmax across the ferroelectric capacitor. This stores a saturation charge Qs in the ferroelectric capacitor. The ferroelectric capacitor, however, includes a linear component in parallel with a switching component. When the electric field is removed, therefore, the linear component discharges and only the residual charge Qr remains in the switching component. The stored "0" is rewritten as a "1" by applying −Vmax to the ferroelectric capacitor. This charges the linear and switching components of the ferroelectric capacitor to a saturation charge of −Qs. The stored charge reverts to −Qr when the electric field is removed. Finally, coercive points $V_C$ and $-V_C$ are minimum voltages on the hysteresis curve that will degrade a stored data state. For example, application of $V_C$ across a ferroelectric capacitor will degrade a stored "1" even though it is not sufficient to store a "0". Thus, it is particularly important to avoid voltages near these coercive points unless the ferroelectric capacitor is being accessed.

Referring to FIG. 3, there is illustrated a typical write sequence for a ferroelectric memory cell as in FIG. 1. Initially, the bitline (BL), wordline (WL), and plateline (PL) are all low. The upper row of hysteresis curves illustrates a write "1" and the lower row represents a write "0". Either a "1" or "0" is initially stored in each exemplary memory cell. The write "1" is performed when the bitline BL and wordline WL are high and the plateline PL is low. This places a negative voltage across the ferroelectric capacitor and charges it to −Qs. When plateline PL goes high, the voltage across the ferroelectric capacitor is 0 V, and the stored charge reverts to −Qr. At the end of the write cycle, both bitline BL and plateline PL go low and stored charge −Qr remains on the ferroelectric capacitor. Alternatively, the write "0" occurs when bitline BL remains low and plateline PL goes high. This places a positive voltage across the ferroelectric capacitor and charges it to Qs representing a stored "1". When plateline PL goes low, the voltage across the ferroelectric capacitor is 0 V, and the stored charge reverts to Qr representing a stored "0".

A step sensing read operation is illustrated at FIG. 4 for the ferroelectric memory cell at FIG. 1. The upper row of hysteresis curves illustrates a read "0". The lower row of hysteresis curves illustrates a read "1". Wordline WL and plateline PL are initially low. Bitlines BL are precharged low. At time $t_0$ precharge signal PRE goes low, permitting the bitlines BL to float. At times $t_1$ and $t_2$ wordline WL and plateline PL go high, respectively, thereby permitting each memory cell connected to the active wordline WL and plateline PL to share charge with a respective bitline. A stored "1" will share more charge with parasitic bitline capacitance $C_{BL}$ and produce a greater bitline voltage than the stored "0" as shown between times $t_2$ and $t_3$. A reference voltage (not shown) is produced at each complementary bitline of an accessed bitline. This reference voltage is between the "1" and "0" voltages at time $t_3$. A difference voltage between either a "1" or "0" voltage and a corresponding reference voltage is applied to each respective sense amplifier. The sense amplifiers are activated at time $t_3$ to amplify the difference voltage. When respective bitline voltages are fully amplified after time $t_3$, the read "0" curve cell charge has increased from Qr to Qs. By way of comparison, the read "1" data state has changed from a stored "1" to a stored "0". Thus, the read "0" operation is nondestructive, but the read "1" operation is destructive. At time $t_4$, plateline PL goes low and applies $-V_{max}$ to the read "1" cell, thereby storing $-Q_s$. At the same time, zero voltage is applied to the read "0" cell and charge $Q_r$ is restored. At the end of the read cycle, signal PRE goes high and it precharges both bitlines BL to zero volts or ground. The wordline goes low, thereby isolating the ferroelectric capacitor from the bitline. Thus, zero volts is applied to the read "1" cell and $-Q_r$ is restored.

Referring now to FIG. 5, a pulse sensing read operation is illustrated for a ferroelectric memory circuit. The read operation begins at time $t_0$ when precharge signal PRE goes low, permitting the bitlines BL to float. Wordline WL and plateline PL are initially low, and bitlines BL are precharged low. At time $t_1$, wordline WL goes high, thereby coupling a ferroelectric capacitor to a respective bitline. Then plateline PL goes high at time $t_2$, thereby permitting each memory cell to share charge with the respective bitline. The ferroelectric memory cells share charge with their respective bitlines BL and develop respective difference voltages. Here, $V_1$ represents a data "1" and $V_0$ represents a data "0". Plateline PL then goes low prior to time $t_3$, and the common mode difference voltage goes to near zero. The difference voltage available for sensing is the difference between one of $V_1$ and $V_0$ at time $t_3$ and a reference voltage (not shown) which lies approximately midway between voltages $V_1$ and $V_0$ at time $t_3$. The difference voltage is amplified at time $t_3$ by respective sense amplifiers and full bitline BL voltages are developed while the plateline PL is low. Thus, the data "1" cell is fully restored while plateline PL is low and the data "1" bitline BL is high. Subsequently, the plateline PL goes high while the data "0" bitline BL remains low. Thus, the data "0" cell is restored. The plateline PL goes low at time $t_4$, and precharge signal PRE goes high at time $t_5$. The high level of precharge signal PRE precharges the bitlines to ground or Vss. The wordline WL goes low at time $t_6$, thereby isolating the ferroelectric capacitor from the bitline and completing the pulse sensing cycle.

A difference voltage at time $t_3$ for both sensing methods of FIGS. 4 and 5 is a significant limitation to operation of the ferroelectric memory circuit. This difference voltage may be less than 80 mV under normal operating conditions. Furthermore, typical sense amplifiers of the prior art may be unable to correctly sense a difference voltage of less than 40 mV due to array noise, thermal noise, and other factors. One such factor is negative bias temperature instability. This instability is caused by high electric fields across thin transistor gate oxides. Accelerated stress tests have shown that these high electric fields may cause p-channel transistor threshold voltages to shift by more than 40 mV over several years under normal operating conditions. A particular problem arises with repeated read operations of a same data state, resulting in an asymmetrical threshold voltage shift. Referring to FIG. 7, for example, there is a schematic diagram of a sense amplifier of the prior art. The sense amplifier includes P-channel transistors 702 and 704 and N-channel transistors 706 and 708. Bitline terminal 750 and complementary bitline terminal 752 are both input and output terminals for the sense amplifier and receive a difference voltage between respective signals BL and /BL as previously described. P-channel transistor 712 and N-channel transistor 722 activate the sense amplifier after a difference voltage is applied. P-channel transistor 712 couples common source terminals of transistors 702 and 704 to power supply voltage Vdd. N-channel transistor 722 couples common source terminals of N-channel transistors 706 and 708 to power supply voltage Vss.

In operation, bitline terminals 750 and 752 are both preferably precharged to ground or Vss as previously described with respect to FIGS. 4 and 5. A wordline of a selected memory cell and its associated plateline are activated, thereby producing a signal on one of bitline terminal 750 or complementary bitline terminal 752. A reference signal is applied to the other of bitline terminal 750 or complementary bitline terminal 752. The sense amplifier is then activated by a low level of complementary sense enable signal /SEN and a high level of sense enable signal SEN. Bitline signals BL and /BL are both initially near ground or Vss as previously described at time $t_3$ with respect to FIGS. 4 and 5. N-channel transistors 706 and 708, therefore, initially have almost no gate-to-source voltage. As a result, they do not initially amplify the difference voltage across bitline terminals 750 and 752. P-channel transistors 702 and 704 have a large negative initial gate-to-source voltage, and must initially amplify the difference voltage until a sufficient gate-to-source voltage is developed across one of N-channel transistors 702 and 704. If a threshold voltage of one of P-channel transistors 702 and 704 has shifted by 40 mV due to negative bias temperature instability, for example, the sense amplifier may incorrectly sense the data signal.

SUMMARY OF THE INVENTION

In accordance with a preferred embodiment of the invention, an amplifier circuit and method to improve stability due to threshold voltage shift is disclosed. The amplifier circuit comprises a first transistor having a current path of a first conductivity type coupled between a first power supply terminal and a first terminal. A second transistor having a current path of the first conductivity type is coupled between the first power supply terminal and a second terminal. A third transistor having a current path of a second conductivity type is coupled between the first terminal and a first input terminal. A fourth transistor having a current path of the second conductivity type is coupled between the second terminal and a second input terminal. A first pull down transistor having a control gate and a current path of the second conductivity type is coupled between the first input terminal and a second power supply terminal. A second pull down transistor having a control gate coupled to the control gate of the first pull down transistor and having a current path of the second conductivity type is coupled between the second input terminal and the second power supply terminal. A third pull down transistor may be included that has a control gate coupled to the control gate of the first pull down transistor and has a current path coupled between the first input terminal and the second input terminal. One or more equalization transistors may be coupled between the first and second input terminals.

In operation, a first power supply voltage is applied to the current paths of the first and second transistors opposite the third and fourth transistors. A voltage signal is applied between the current paths of the third and fourth transistors opposite the first and second transistors. The voltage signal is amplified. After the step of amplifying the voltage signal, a control signal is applied to couple the current paths of the third and fourth transistors opposite the first and second transistors to a second power supply voltage.

BRIEF DESCRIPTION OF THE DRAWINGS

The foregoing features of the present invention may be more fully understood from the following detailed description, read in conjunction with the accompanying drawings, wherein:

FIG. 1 is a circuit diagram of a ferroelectric memory cell of the prior art;

FIG. 2 is a hysteresis curve of the ferroelectric capacitor 100 of FIG. 1;

FIG. 3 is a timing diagram showing a write operation to the ferroelectric memory cell of FIG. 1;

DETAILED DESCRIPTION OF PREFERRED EMBODIMENTS

Figure 12:
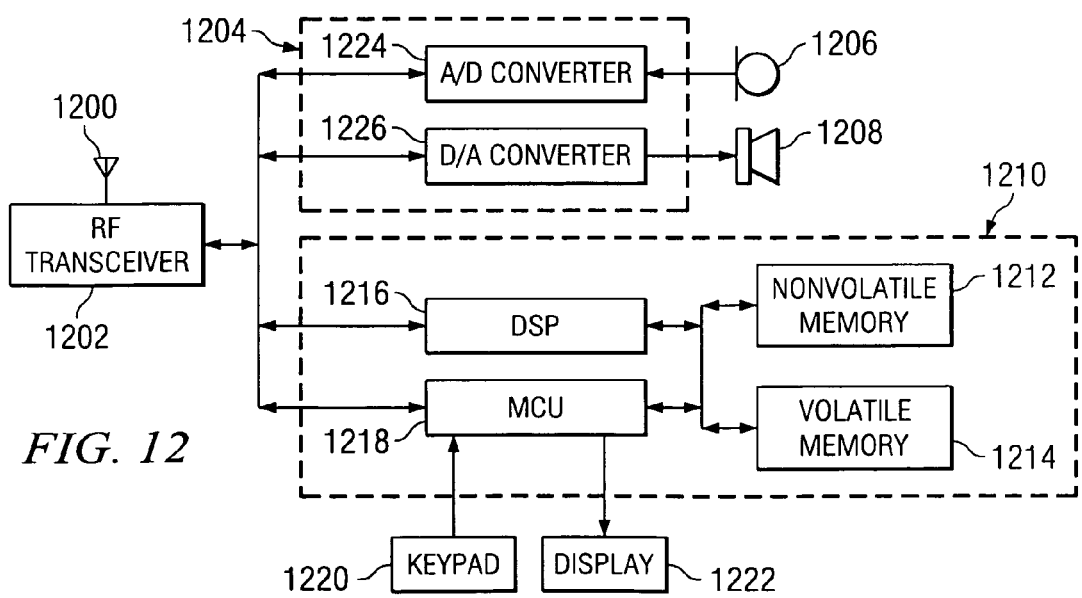
FIG. 12 is a block diagram of a wireless telephone as an example of a portable electronic device which could advantageously employ the present invention.

Referring to FIG. 12, there is a block diagram of a wireless telephone as an example of a portable electronic device which could advantageously employ this invention in memory arrays as is known in the art. The wireless telephone includes antenna 1200, radio frequency transceiver 1202, baseband circuits 1210, microphone 1206, speaker 1208, keypad 1220, and display 1222. The wireless telephone is preferably powered by a rechargeable battery (not shown) as is well known in the art. Antenna 1200 permits the wireless telephone to interact with the radio frequency environment for wireless telephony in a manner known in the art. Radio frequency transceiver 1202 both transmits and receives radio frequency signals via antenna 1200. The transmitted signals are modulated by the voice/data output signals received from baseband circuits 1210. The received signals are demodulated and supplied to baseband circuits 1210 as voice/data input signals. An analog section 1204 includes an analog to digital converter 1224 connected to microphone 1206 to receive analog voice signals. The analog to digital converter 1224 converts these analog voice signals to digital data and applies them to digital signal processor 1216. Analog section 1204 also includes a digital to analog converter 1226 connected to speaker 1208. Speaker 1208 provides the voice output to the user. Digital section 1210 is embodied in one or more integrated circuits and includes a microcontroller unit 1218, a digital signal processor 1216, nonvolatile memory circuit 1212, and volatile memory circuit 1214. Nonvolatile memory circuit 1212 may include read only memory (ROM), ferroelectric memory (FeRAM), FLASH memory, or other nonvolatile memory as known in the art. Volatile memory circuit 1214 may include dynamic random access memory (DRAM), static random access memory (SRAM), or other volatile memory circuits as known in the art. Microcontroller unit 1218 interacts with keypad 1220 to receive telephone number inputs and control inputs from the user. Microcontroller unit 1218 supplies the drive function to display 1222 to display numbers dialed, the current state of the telephone such as battery life remaining, and received alphanumeric messages. Digital signal processor 1216 provides real time signal processing for transmit encoding, receive decoding, error detection and correction, echo cancellation, voice band filtering, etc. Both microcontroller unit 1218 and digital signal processor 1216 interface with nonvolatile memory circuit 1212 for program instructions and user profile data. Microcontroller unit 1218 and digital signal processor 1216 also interface with volatile memory circuit 1214 for signal processing, voice recognition processing, and other applications.

Figure 6:
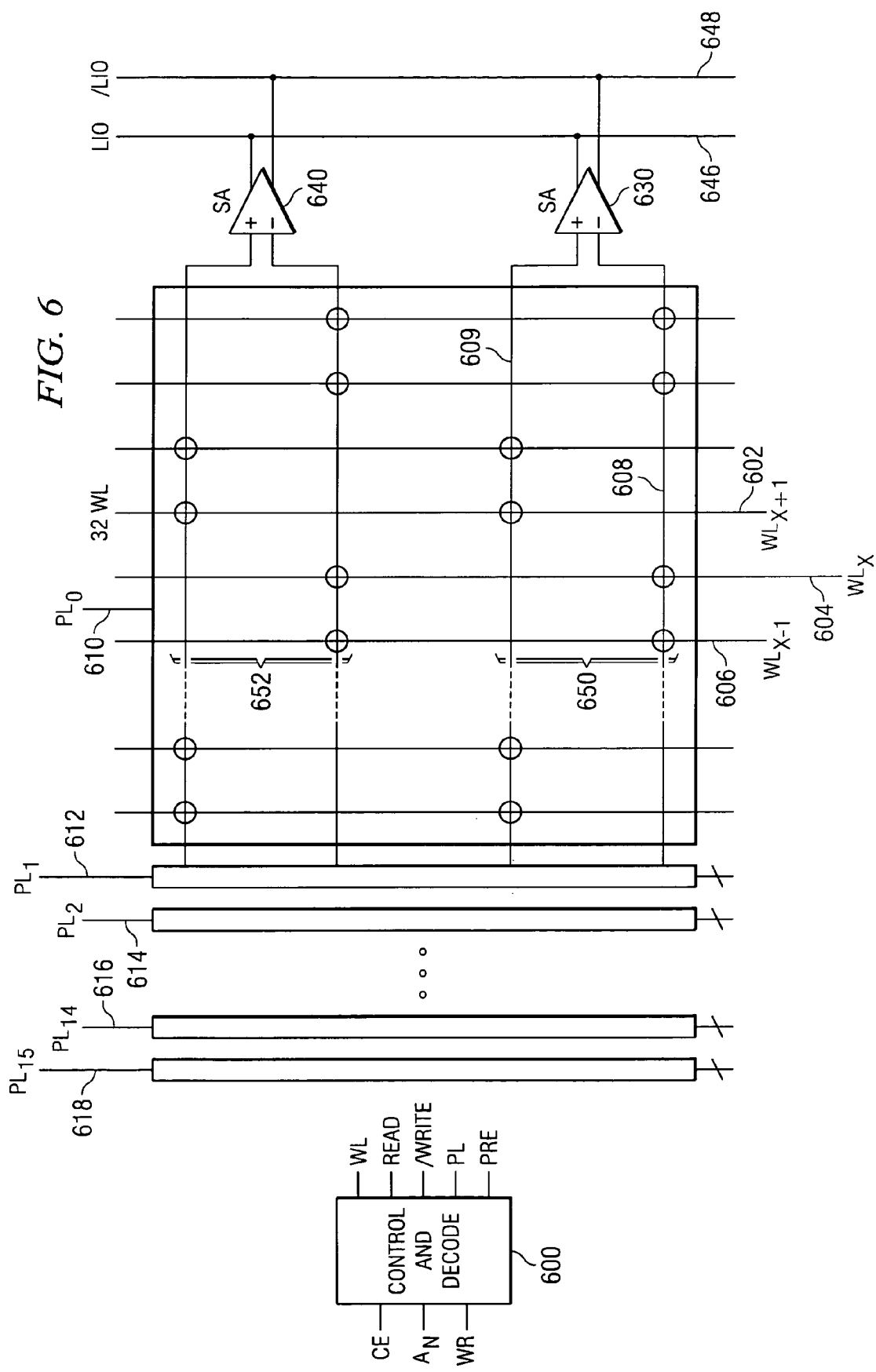
FIG. 6 is a schematic diagram of a of the memory circuit that may use a sense amplifier of the present invention.
Figure 7:
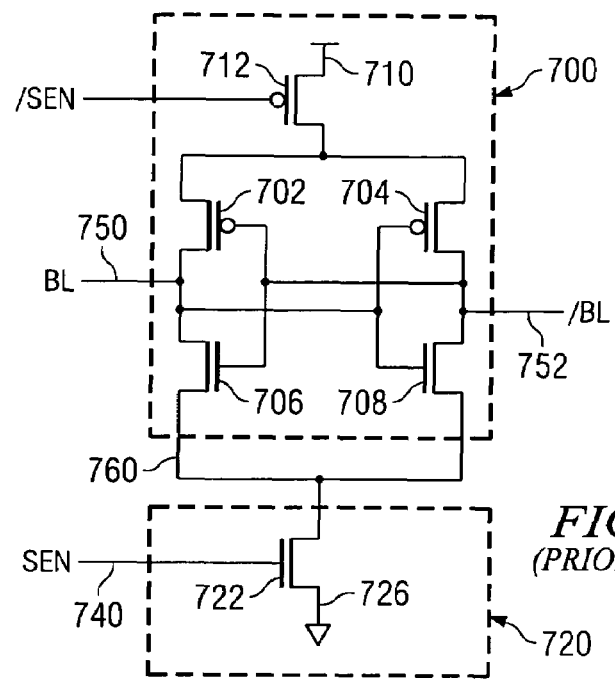
FIG. 7 is a schematic diagram of a sense amplifier circuit of the prior art.

Referring to FIG. 6, there is a schematic diagram of a ferroelectric memory circuit. Although the memory circuit includes many similar memory arrays, only a portion of the array is shown for clarity. The memory array includes memory cells arranged in rows corresponding to wordlines 602, 604, 606 and columns 650, 652. Individual memory cells are indicated by circles at intersections of rows and columns. The memory circuit includes 16 platelines 610–618. Each plateline is coupled to receive a respective plateline signal $PL_0$–$PL_{15}$. Each plateline, for example plateline 610, is common to 32 rows of memory cells including rows common to wordlines 602–606. Each row of memory cells is selected by an active wordline signal. For example, row 604 is selected by active wordline signal $WL_X$ on wordline 604. Each column includes a bitline 608 and a complementary bitline 609 that form a bitline pair. Each bitline pair is coupled to a respective sense amplifier circuit such as sense amplifier circuit 630. Each sense amplifier circuit has complementary output terminals coupled to local input/output lines LIO 646 and /LIO 648.

In operation, the control and decode circuit 600 receives a chip enable signal CE, an address signal $A_N$ including N address bits, and a read/write signal WR. The control and decode circuit produces an active wordline signal WL, an active plateline signal PL, and a precharge signal PRE. (WL and PL represent a respective group of wordlines and platelines.) A selected memory cell at the intersection of the addressed row and column receives or produces data on a respective bitline in response to a logical state of read/write signal WR. For example, when signal WR is high, control and decode circuit 600 produces a low READ and a low /WRITE signals and a write operation is performed. Alternatively, when signal WR is low, control and decode circuit 600 produces a high READ and a high /WRITE signal and a read operation is performed. For either a read or a write operation, when a wordline signal such as wordline signal $WL_X$ goes active high, a row of memory cells indicated by circles at intersections of the wordline and bitlines is selected. During a read operation, the data corresponding to each memory cell is then sensed by a sense amplifier circuit such as sense amplifier 630 as will be described in detail. Amplified data is conducted to local input/output leads 646 and 648.

Figure 11:
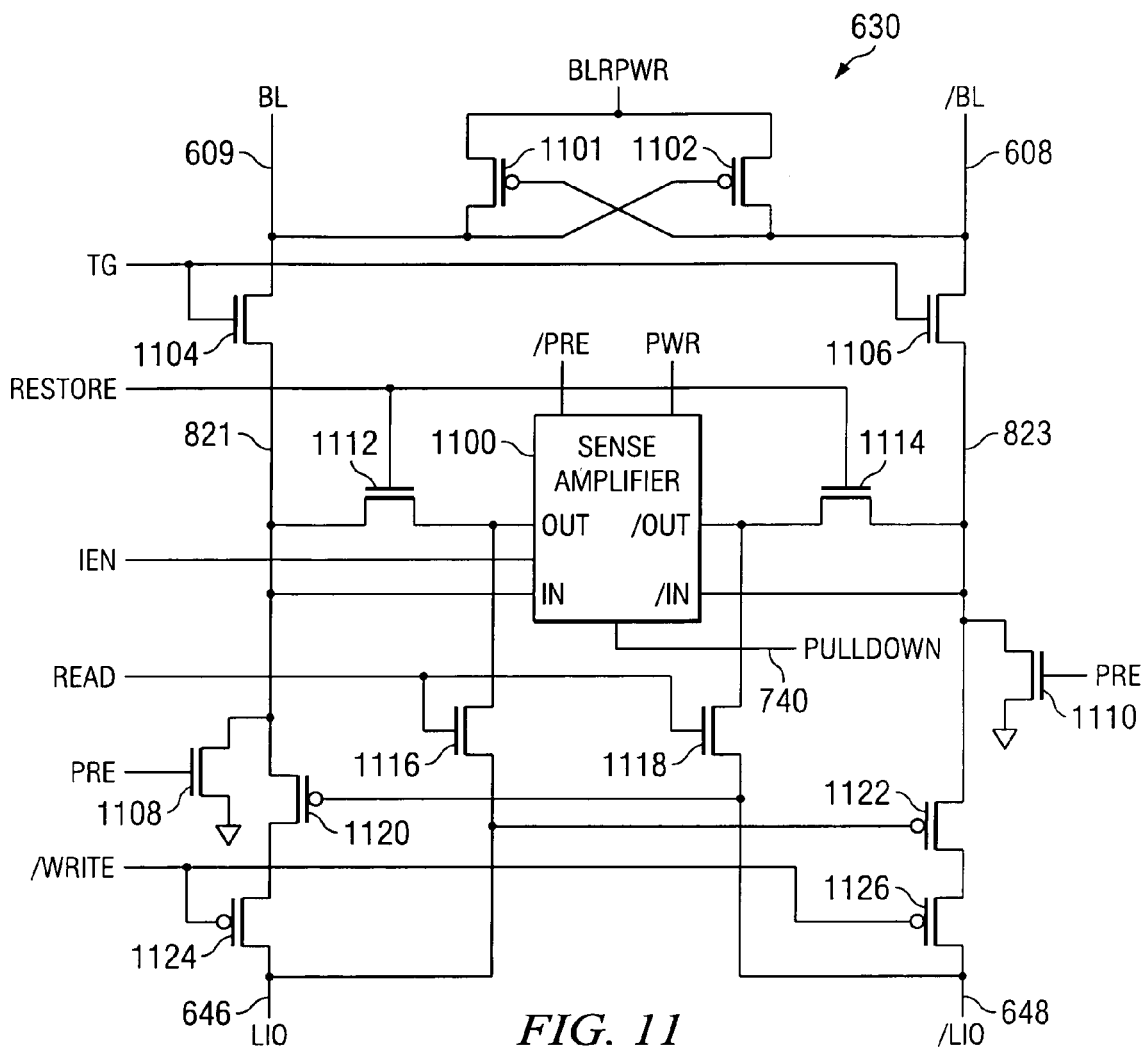
FIG. 11 is a waveform diagram showing simulated operation of the embodiment of FIG. 10.

Referring to FIG. 11, there is a sense amplifier circuit 630 of the present invention. The same identification numerals are used to indicate previously described circuit elements. The sense amplifier circuit 630 includes a sense amplifier 1100 of the present invention. Input terminals 821 and 823 of sense amplifier 1100 are respectively coupled to bitlines 609 and 608 by N-channel transfer gate transistors 1104 and 1106 in response to a high level of signal TG. Signals /WRITE and READ are initially high and low, respectively. During a read operation, the output terminals of sense amplifier 1100 are coupled to local input/output leads 646 and 648 by N-channel read transistors 1116 and 1118, respectively, when READ goes high. P-channel write transistors 1124 and 1126 are off in response to the high level of write signal /WRITE. Alternatively, for a write operation, P-channel write transistors 1124 and 1126 are on in response to a low level of write signal /WRITE. N-channel read transistors 1116 and 1118 are off in response to a low level of read signal READ. N-channel precharge transistors 1108 and 1110 initially precharge input terminals 821 and 823 and corresponding bitlines 609 and 608 to ground or Vss. N-channel transistors 1112 and 1114 are initially off in response to a low level of signal RESTORE.

Figure 4:
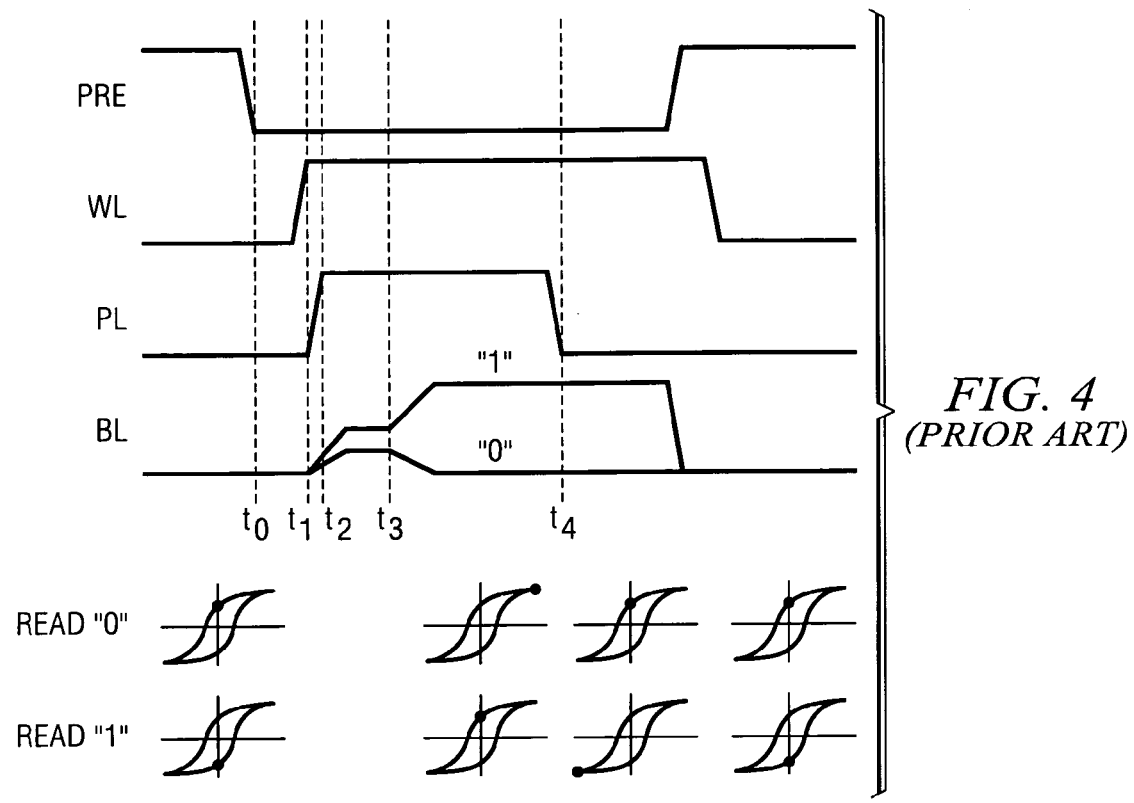
FIG. 4 is a timing diagram of a step sense read operation from the ferroelectric memory cell of FIG. 1.
Figure 5:
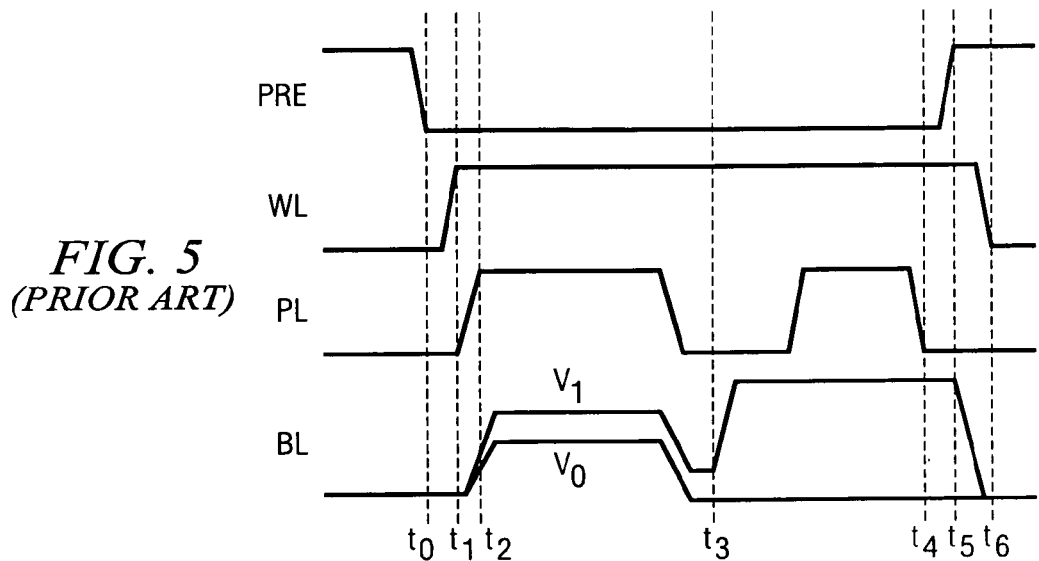
FIG. 5 is a timing diagram of a pulse sense read operation from the ferroelectric memory cell of FIG. 1.

During a read operation, precharge signals PRE and /PRE are set low and high respectively. Signals PWR, BLRPWR, and PULLDOWN are initially low. An active wordline selects a memory cell on bitline BL 609 or complementary bitline /BL 608. A difference voltage is developed across bitline BL 609 and complementary bitline /BL 608 as previously described with respect to FIGS. 4 and 5. This difference voltage is applied to sense amplifier input terminals 821 and 823 via N-channel transfer gate transistors 1104 and 1106. A high level of input enable signal IEN applies this difference voltage to sense amplifier 1100 to initially amplify the difference voltage. A high level of signal PULLDOWN completes amplification of the difference voltage as will be described in detail. An amplified difference voltage is subsequently produced at output terminals OUT and /OUT of sense amplifier 1100. This amplified difference voltage is conducted to local input/output leads 646 and 648. A high level of signal RESTORE turns on N-channel transistors 1112 and 1114, thereby producing the amplified difference voltage on sense amplifier input terminals 821 and 823 and bitlines 609 and 608, respectively. A high level of signal BLRPWR turns on one of P-channel transistors 1101 and 1102, thereby restoring a full Vdd level on the respective high bitline.

Figure 8:
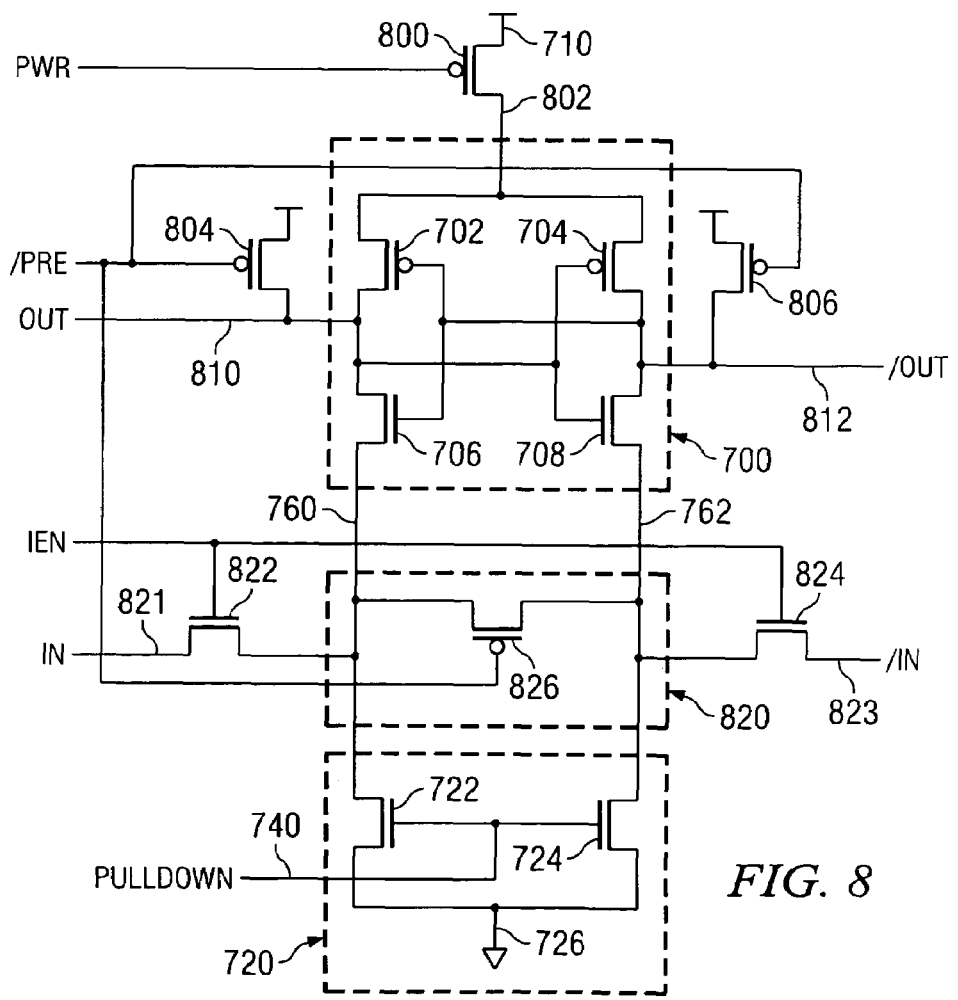
FIG. 8 is a schematic diagram of a first embodiment of a sense amplifier of the present invention.

Referring now to FIG. 8 there is a schematic diagram of a first embodiment of a sense amplifier 1100 of the present invention. The sense amplifier includes three sections indicated by dashed lines. Amplifier section 700 includes P-channel transistors 702 and 704 and N-channel transistors 706 and 708. The common source terminal 802 of P-channel transistors 702 and 704 is coupled to power supply terminal Vdd 710 by P-channel transistor 800. Sense amplifier input terminals 760 and 762 are coupled to bitline input terminals 821 and 823 by N-channel input transistors 822 and 824, respectively, in response to a high level of input enable signal IEN. Bitline input terminals 821 and 823 are coupled to receive data from selected memory cells. Output terminals 810 and 812 produce amplified data from a difference voltage at sense amplifier input terminals 760 and 762. The sense amplifier input terminals are also coupled to P-channel transistor 826 of equalization section 820. P-channel transistors 804, 806, and 826 are activated by a low level of precharge signal /PRE prior to sense amplifier activation. P-channel transistors 804 and 806 preferably precharge sense amplifier output terminals 810 and 812 to power supply voltage Vdd. In other embodiments of the present invention, precharge transistors may precharge respective terminals to other voltage supplies. P-channel transistor 826 equalizes the voltage across input terminals 760 and 762 prior to application of a difference voltage from a selected memory cell. Activation section 720, including N-channel transistors 722 and 724, is activated by a high level of signal PULLDOWN after a difference voltage is applied to input terminals 760 and 762 and amplified.

Figure 9:
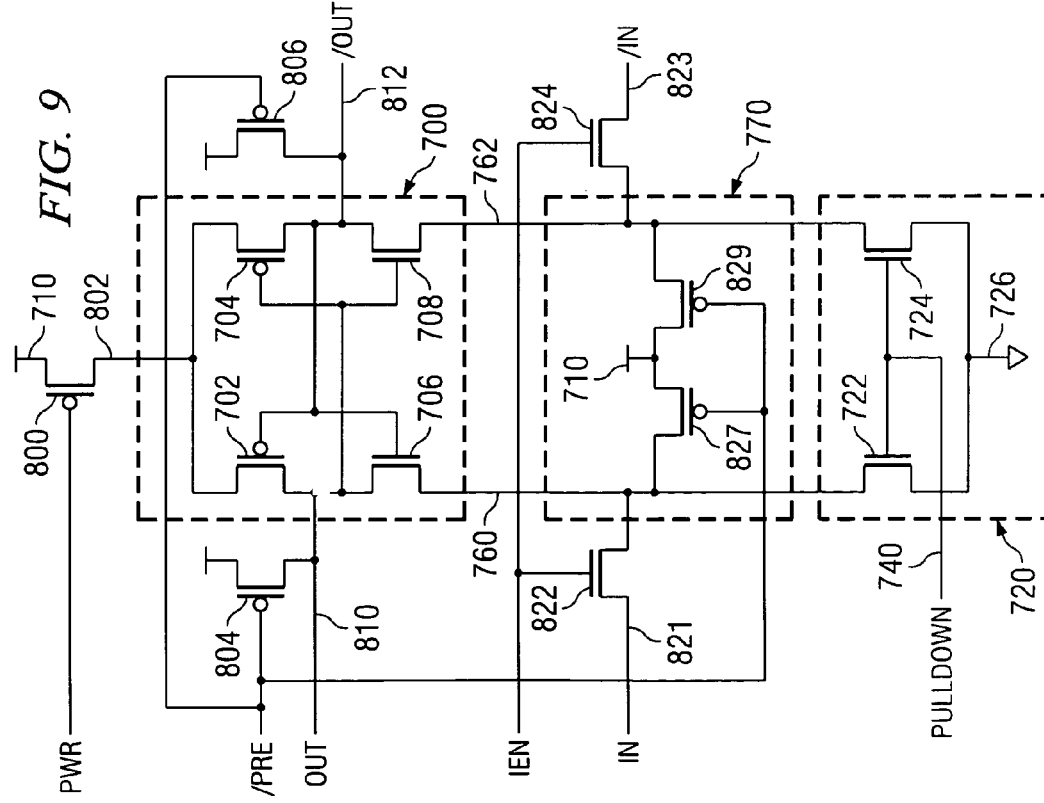
FIG. 9 is a schematic diagram of a second embodiment of a sense amplifier of the present invention.

FIG. 9 is a schematic diagram of a second embodiment of a sense amplifier of the present invention. The same reference numerals are used to indicate common elements with the embodiment of FIG. 8. The schematic diagram of FIG. 9 is the same as FIG. 8 except for equalization section 770. Equalization section 770 includes P-channel transistors 827 and 829 having a common source terminal connected to Vdd supply voltage terminal 710. P-channel transistors 827 and 829 advantageously couple both input terminals 760 and 762 to supply voltage terminal Vdd 710 in response to a low level of precharge signal /PRE. Both input and output terminals are, therefore, equalized to supply voltage Vdd prior to application of a difference voltage. In particular, this high level equalization of input terminals 760 and 762 insures that both P-channel transistors 702 and 704 and N-channel transistors 706 and 708 of amplifier section 700 remain off prior to application of the difference voltage. Thus, no imbalance in amplifier section develops after precharge signal /PRE goes high and before a difference voltage is applied to input terminals 760 and 762.

Figure 10A:
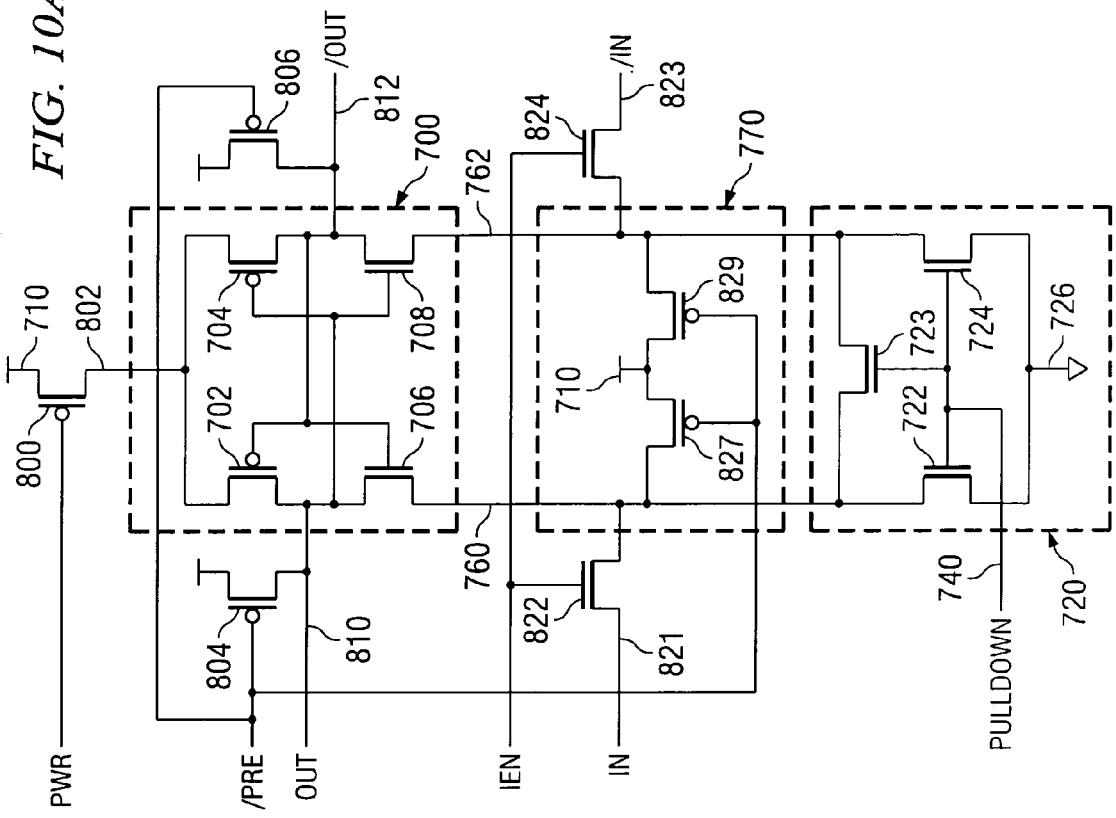
FIG. 10A is a schematic diagram of a third embodiment of a sense amplifier of the present invention.

Referring to FIG. 10A there is a schematic diagram of a third embodiment of a sense amplifier of the present invention. The same reference numerals are used to indicate common elements with the embodiment of FIG. 9. The schematic diagram of FIG. 10A is the same as FIG. 9 except for activation section 720. Activation section 720 includes N-channel transistor 723 together with N-channel transistors 722 and 724. N-channel transistor 723 advantageously increases the effective width and decreases the corresponding resistance of pull down section 720. After application of a difference voltage to input terminals 760 and 762, for example, one of N-channel transistors 706 and 708 is on and the other is off. A high level of activation signal PULLDOWN at lead 740 turns on N-channel transistors 722, 723, and 724. The high level activation signal PULLDOWN 740 is advantageously applied after a sufficient difference voltage is developed between terminals 810 and 812. If N-channel transistor 706 is on and N-channel transistor 708 is off, then terminals 760 and 810 are discharged by N-channel transistor 722 in parallel with the series combination of N-channel transistors 723 and 724. These parallel conduction paths decrease the resistance of activation section 720.

Figure 10B:
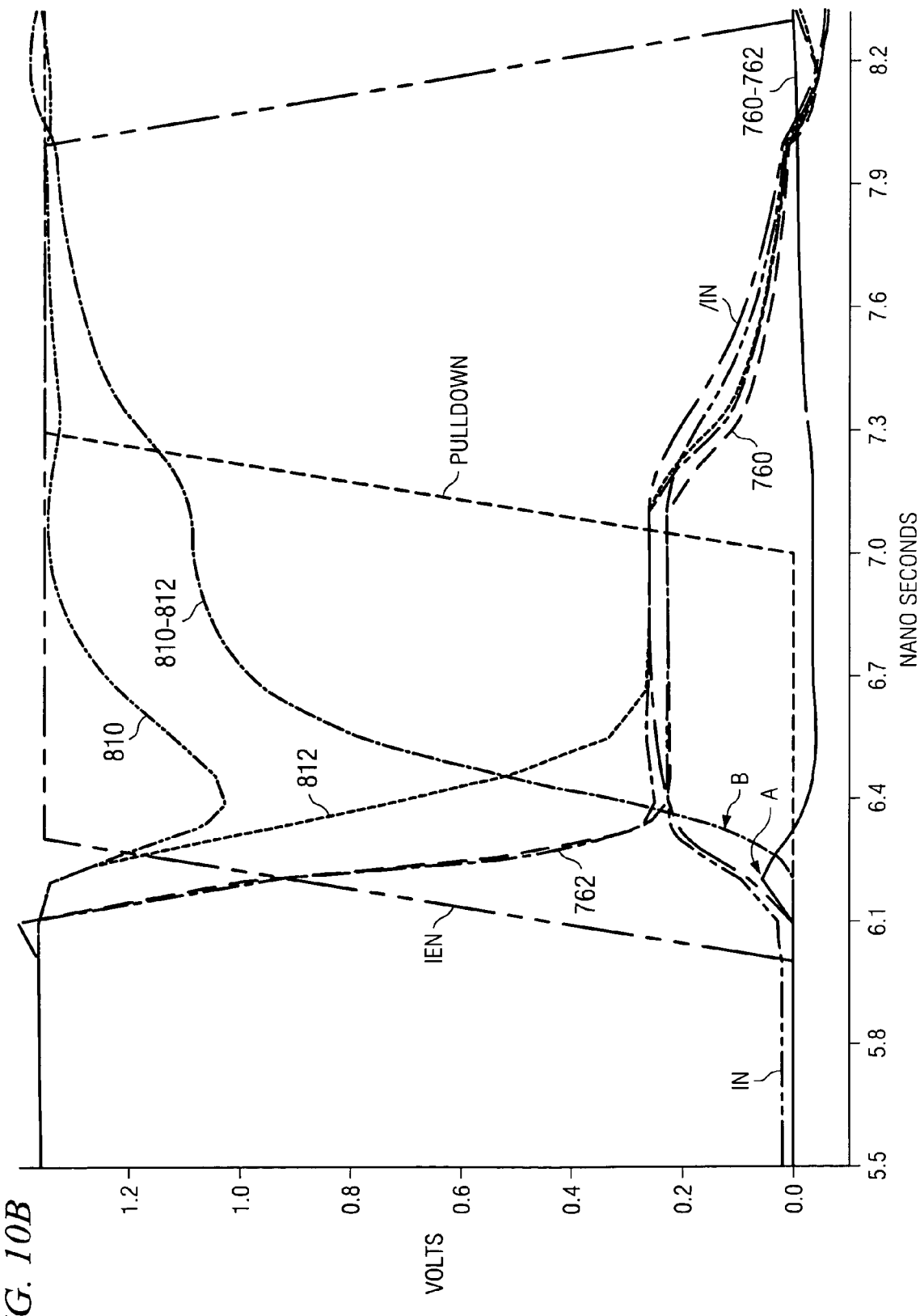
FIG. 10B is a simulation diagram of the sense amplifier of FIG. 10A.

Turning now to FIG. 10B with reference to FIG. 10A, operation of the sense amplifier of FIG. 10A will be explained in detail. Initial conditions for the simulation diagram include a Vdd supply voltage of 1.35 V. At this supply voltage, a memory cell storing a true one would typically produce 150 mV to 300 mV. Alternatively, a memory cell storing a true zero would typically produce 0 mV to 25 mV. An intermediate reference voltage might vary from 75 mV to 100 mV. Thus, a worst case difference voltage is typically 50 mV for either a true one or true zero during a read operation. For the simulation of FIG. 10B, however, an input voltage of 120 mV is applied to terminal 821 and a reference voltage of 100 mV is applied to terminal 823 for a simulated difference voltage of 20 mV. Furthermore, the threshold voltage of P-channel transistor 704 is 50 mV greater than the threshold voltage of P-channel transistor 702 to simulate an imbalance of P-channel transistors in amplifier section 700.

Signal PWR is initially low, and P-channel transistor 800 is on. Thus, voltage at the common source terminal of P-channel transistors 702 and 704 is high. P-channel transistors 804 and 806 precharge sense amplifier output terminals 810 and 812 to supply voltage Vdd in response to a low level of precharge signal /PRE. P-channel transistors 827 and 829 precharge sense amplifier input terminals 760 and 762 to supply voltage Vdd. At 5 ns simulation time (not shown), precharge signal /PRE goes high, turning off P-channel transistors 804, 806, 827, and 829. At 6 ns simulation time, input enable signal IEN goes high and applies the difference voltage at terminals IN 821 and /IN 823 to sense amplifier input terminals 760 and 762, respectively. N-channel input transistors 822 and 824 rapidly discharge sense amplifier input terminals 760 and 762 as they share charge with respective input terminals 821 and 823. N-channel transistors 706 and 708 turn on with increasing gate-to-source voltage, thereby discharging sense amplifier output terminals 810 and 812. At a time 6.2 ns simulation time the initial 20 mV difference between input terminals 821 and 823 has been substantially amplified at input terminals 760 and 762. The difference voltage 760–762 at point A is 50 mV after N-channel transistors 706 and 708 initially turn on. This amplification of the difference voltage by N-channel transistors 706 and 708 is highly advantageous in overcoming a P-channel transistor threshold voltage imbalance. Even with a simulated 50 mV P-channel transistor threshold voltage imbalance, the sense amplifier correctly senses a 20 mV difference voltage. Other simulations show that the sense amplifier of FIG. 10A correctly senses a 10 mV difference voltage with up to a 275 mV threshold voltage imbalance of P-channel transistors 702 and 704.

Subsequently, at 6.3 ns simulation time, P-channel transistor 702 turns on while P-channel transistor 704 is still off. As indicated by point B, the difference voltage 810–812 between output terminals 810 and 812 is then 100 mV. The difference voltage at output terminals 810 and 812 is further amplified, thereby turning off N-channel transistor 706 and latching the amplifier section 700. Activation signal PULLDOWN 740 goes high at 7.3 ns simulation time and turns on N-channel transistors 722, 723, and 724. The transition of activation signal PULLDOWN 740 advantageously begins when a difference voltage between output terminals 810 and 812 (810–812) is greater than 1.0 V. In response, input terminals 760 and 762 go low to Vss supply voltage together with output terminal 812. Finally, at 8.3 ns simulation time input enable signal IEN goes low, turning off N-channel transistors 822 and 824.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An amplifier circuit, comprising:
a first power supply terminal;
a second power supply terminal;
a first terminal;
a second terminal;
a first input terminal;
a second input terminal;
a first transistor having a current path of a first conductivity type coupled between the first power supply terminal and the first terminal;
a second transistor having a current path of the first conductivity type coupled between the first power supply terminal and the second terminal;
a third transistor having a current path of a second conductivity type coupled between the first terminal and the first input terminal;
a fourth transistor having a current path of the second conductivity type coupled between the second terminal and the second input terminal;
a first pull down transistor having a control gate and a current path of the second conductivity type, the current path coupled between the first input terminal and the second power supply terminal;
a second pull down transistor having a control gate coupled to the control gate of the first pull down transistor and coupled to receive a control signal, and having a current path of the second conductivity type coupled between the second input terminal and the second power supply terminal; and
a third pull down transistor having a control gate coupled to the control gate of the first pull down transistor, and having a current path coupled between the first input terminal and the second input terminal.

2. An amplifier circuit as in claim 1, wherein the first conductivity type current path is P-channel, and wherein the second conductivity type current path is N-channel.

3. An amplifier circuit as in claim 1, wherein a control terminal of the third transistor is coupled to the second terminal, and wherein a control terminal of the fourth transistor is coupled to the first terminal.

4. An amplifier circuit as in claim 1, wherein the first terminal is coupled to a control terminal of the second transistor, and wherein the second terminal is coupled to a control terminal of the first transistor.

5. An amplifier circuit as in claim 1, wherein a control terminal of the third transistor is coupled to the second terminal, wherein a control terminal of the fourth transistor is coupled to the first terminal, wherein the first terminal is coupled to a control terminal of the second transistor, and wherein the second terminal is coupled to a control terminal of the first transistor.

6. An amplifier circuit as in claim 1, comprising:
a fifth transistor having a current path of the second conductivity type coupled between the first input terminal and a first bitline terminal; and
a sixth transistor having a current path of the second conductivity type coupled between the second input terminal and a second bitline terminal.

7. An amplifier circuit as in claim 1, wherein the current paths of the first and second transistors are coupled to the first power supply terminal through a fifth transistor having the first conductivity type.

8. An amplifier circuit as in claim 1, comprising:
a first precharge transistor coupled between the first power supply terminal and the first terminal; and
a second precharge transistor coupled between the first power supply terminal and the second terminal.

9. An amplifier circuit as in claim 8, wherein the first and second precharge transistors have current paths of the first conductivity type.

10. An amplifier circuit as in claim 1, comprising:
a third power supply terminal;
a first precharge transistor coupled between the third power supply terminal and the first terminal; and
a second precharge transistor coupled between the third power supply terminal and the second terminal.

11. An amplifier circuit as in claim 1, comprising:
a first precharge transistor coupled to the first input terminal; and
a second precharge transistor coupled to the second input terminal.

12. An amplifier circuit as in claim 11, wherein the first and second precharge transistors have current paths of the first conductivity type.

13. An amplifier circuit as in claim 12, comprising:
a third power supply terminal, wherein the current paths of the first and second precharge transistors are coupled to a third power supply terminal.

14. An amplifier circuit as in claim 12, wherein the current paths of the first and second precharge transistors are coupled to the first power supply terminal.

15. An amplifier circuit as in claim 1, comprising a first equalization transistor having a current path coupled between the first terminal and the second terminal, wherein the first equalization transistor has current path of the first conductivity type.

16. A portable electronic device, comprising:
an integrated circuit;
a processor circuit formed on the integrated circuit;
a memory circuit formed on the integrated circuit and coupled to the processor circuit;
a plurality of sense amplifier circuits formed in the memory circuit, each sense amplifier circuit comprising:
a first power supply terminal;
a second power supply terminal;
a first terminal;
a second terminal;
a first input terminal;
a second input terminal;
a first transistor having a current path of a first conductivity type coupled between the first power supply terminal and the first terminal;
a second transistor having a current path of the first conductivity type coupled between the first power supply terminal and the second terminal;
a third transistor having a current path of a second conductivity type coupled between the first terminal and the first input terminal;
a fourth transistor having a current path of the second conductivity type coupled between the second terminal and the second input terminal;
a first pull down transistor having a control gate and a current path of the second conductivity type, the current path coupled between the first input terminal and the second power supply terminal;
a second pull down transistor having a control gate coupled to the control gate of the first pull down transistor and coupled to receive a control signal, and having a current path of the second conductivity type coupled between the second input terminal and the second power supply terminal; and
a third pull down transistor having a control gate coupled to the control gate of the first pull down transistor, and having a current path coupled between the first input terminal and the second input terminal.

17. A portable electronic device as in claim 16, wherein a control terminal of the third transistor is coupled to the second terminal, and wherein a control terminal of the fourth transistor is coupled to the first terminal.

18. A portable electronic device as in claim 16, wherein the first terminal is coupled to a control terminal of the second transistor, and wherein the second terminal is coupled to a control terminal of the first transistor.

19. A portable electronic device as in claim 16, wherein the first conductivity type current path is P-channel, and wherein the second conductivity type current path is N-channel.

20. A portable electronic device as in claim 16, wherein the memory circuit is a nonvolatile memory circuit.

21. A portable electronic device as in claim 16, wherein the memory circuit is a volatile memory circuit.

22. A portable electronic device as in claim 16, wherein the processor circuit comprises a digital signal processor circuit.

23. A portable electronic device as in claim 16, wherein the integrated circuit comprises:
an analog-to-digital converter circuit; and
a digital-to-analog converter circuit.

24. A portable electronic device as in claim 16, comprising:
a fifth transistor having a current path of the second conductivity type coupled between the first input terminal and a first bitline terminal; and
a sixth transistor having a current path of the second conductivity type coupled between the second input terminal and a second bitline terminal.

25. A portable electronic device as in claim 24, comprising a plurality of memory cells coupled to respective first and second bitline terminals.

26. A portable electronic device as in claim 25, wherein each memory cell of the plurality of memory cells comprises Lead Zirconate Titanate (PZT).

27. A portable electronic device as in claim 25, wherein each memory cell of the plurality of memory cells comprises Strontium Bismuth Titanate (SBT).

28. A portable electronic device as in claim 25, wherein each memory cell of the plurality of memory cells is a dynamic random access memory cell.

29. A portable electronic device as in claim 16, wherein the current paths of the first and second transistors are coupled to the first power supply terminal through a fifth transistor having the first conductivity type.

30. A portable electronic device as in claim 16, comprising:
a first precharge transistor coupled between the first power supply terminal and the first terminal; and
a second precharge transistor coupled between the first power supply terminal and the second terminal.

31. A portable electronic device as in claim 30, comprising:
a third precharge transistor coupled to the first input terminal; and
a fourth precharge transistor coupled to the second input terminal.

32. A portable electronic device as in claim 31, wherein the first, second, third, and fourth precharge transistors have current paths of the first conductivity type.

33. A portable electronic device as in claim 16, comprising:
a third power supply terminal;
a first precharge transistor coupled between a third power supply terminal and the first terminal; and
a second precharge transistor coupled between the third power supply terminal and the second terminal.

34. A portable electronic device as in claim 33, comprising:
a third precharge transistor coupled to the first input terminal; and
a fourth precharge transistor coupled to the second input terminal.

35. A portable electronic device as in claim 34, wherein the first, second, third, and fourth precharge transistors have current paths of the first conductivity type.

* * * * *